(12) United States Patent
Su et al.

(10) Patent No.: US 8,310,277 B2
(45) Date of Patent: Nov. 13, 2012

(54) HIGH LINEAR FAST PEAK DETECTOR

(75) Inventors: Wenjun Su, San Diego, CA (US); Aristotele Hadjichristos, San Diego, CA (US); Marco Cassia, San Diego, CA (US); Chiewcharn Narathong, Laguna Nigel, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 194 days.

(21) Appl. No.: 12/718,806

(22) Filed: Mar. 5, 2010

(65) Prior Publication Data

US 2011/0050285 A1 Mar. 3, 2011

Related U.S. Application Data

(60) Provisional application No. 61/237,625, filed on Aug. 27, 2009.

(51) Int. Cl.
*H03K 5/153* (2006.01)

(52) U.S. Cl. .................. 327/58; 327/60; 327/62

(58) Field of Classification Search ............... 327/58–62
See application file for complete search history.

(56) References Cited

U.S. PATENT DOCUMENTS

| | | | |
|---|---|---|---|
| 3,982,434 A * | 9/1976 | McMurtrie | 73/861.22 |
| 4,866,301 A | 9/1989 | Smith | |
| 4,992,674 A * | 2/1991 | Smith | 327/59 |
| 5,025,176 A * | 6/1991 | Takeno | 327/58 |
| 5,324,994 A | 6/1994 | Sullivan et al. | |
| 5,428,307 A * | 6/1995 | Dendinger | 327/62 |
| 5,614,851 A * | 3/1997 | Holzer et al. | 327/58 |
| 5,828,240 A * | 10/1998 | Smith | 327/62 |
| 6,051,997 A * | 4/2000 | Yeung et al. | 327/58 |
| 6,100,680 A * | 8/2000 | Vig et al. | 324/207.2 |
| 6,211,716 B1 * | 4/2001 | Nguyen et al. | 327/307 |
| 6,232,802 B1 * | 5/2001 | Chang et al. | 327/59 |
| 7,095,256 B1 * | 8/2006 | Zhak et al. | 327/58 |
| 2009/0322379 A1 | 12/2009 | Tomita | |

FOREIGN PATENT DOCUMENTS

CA 1183580 3/1985

OTHER PUBLICATIONS

International Search Report and Written Opinion—PCT/US2010/046915—ISA/EPO—Apr. 4, 2011 (093356WO).

* cited by examiner

*Primary Examiner* — Kenneth B. Wells
(74) *Attorney, Agent, or Firm* — Ramin Mobarhan

(57) ABSTRACT

A high linear fast peak detector having a variable bias current and/or a variable bias voltage is described. In an exemplary design, the peak detector includes a transistor, a variable current source, a capacitor, and a feedback circuit. The transistor receives the input signal and provides a source current. The variable current source receives the input signal, provides high bias current when the input signal is low, and provides low bias current when the input signal is high. The capacitor is charged by the source current when the input signal is high and is discharged by the high bias current when the input signal is low. The feedback circuit receives a detected signal from the capacitor and provides higher bias voltage for the transistor when the input signal is high, which results in higher source current from the transistor.

30 Claims, 10 Drawing Sheets

HIGH LINEAR FAST PEAK DETECTOR

CLAIM OF PRIORITY UNDER 35 U.S.C. §119

The present application for patent claims priority to Provisional U.S. Application Ser. No. 61/237,625, entitled "HIGH LINEAR FAST PEAK DETECTOR," filed Aug. 27, 2009, assigned to the assignee hereof, and expressly incorporated herein by reference.

BACKGROUND

I. Field

The present disclosure relates generally to electronics, and more specifically to a peak detector.

II. Background

A wireless communication device typically includes a transmitter to support data transmission. The transmitter typically includes a power amplifier (PA) to amplify a radio frequency (RF) signal and provide high output power. The power amplifier may be designed to drive a particular load impedance, e.g., 50 Ohms. The load impedance may vary due to various disturbances and may result in the power amplifier observing a high peak voltage. The high peak voltage may exceed a level that can ensure reliable operation of the power amplifier. It may be desirable to detect for high peak voltage and perform corrective actions, as necessary, so that the power amplifier can be protected from the high peak voltage.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Various exemplary designs of a high linear fast peak detector that can detect for high peak voltage are described herein. The peak detector may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the peak detector for a wireless communication device is described below.

Figure 1:
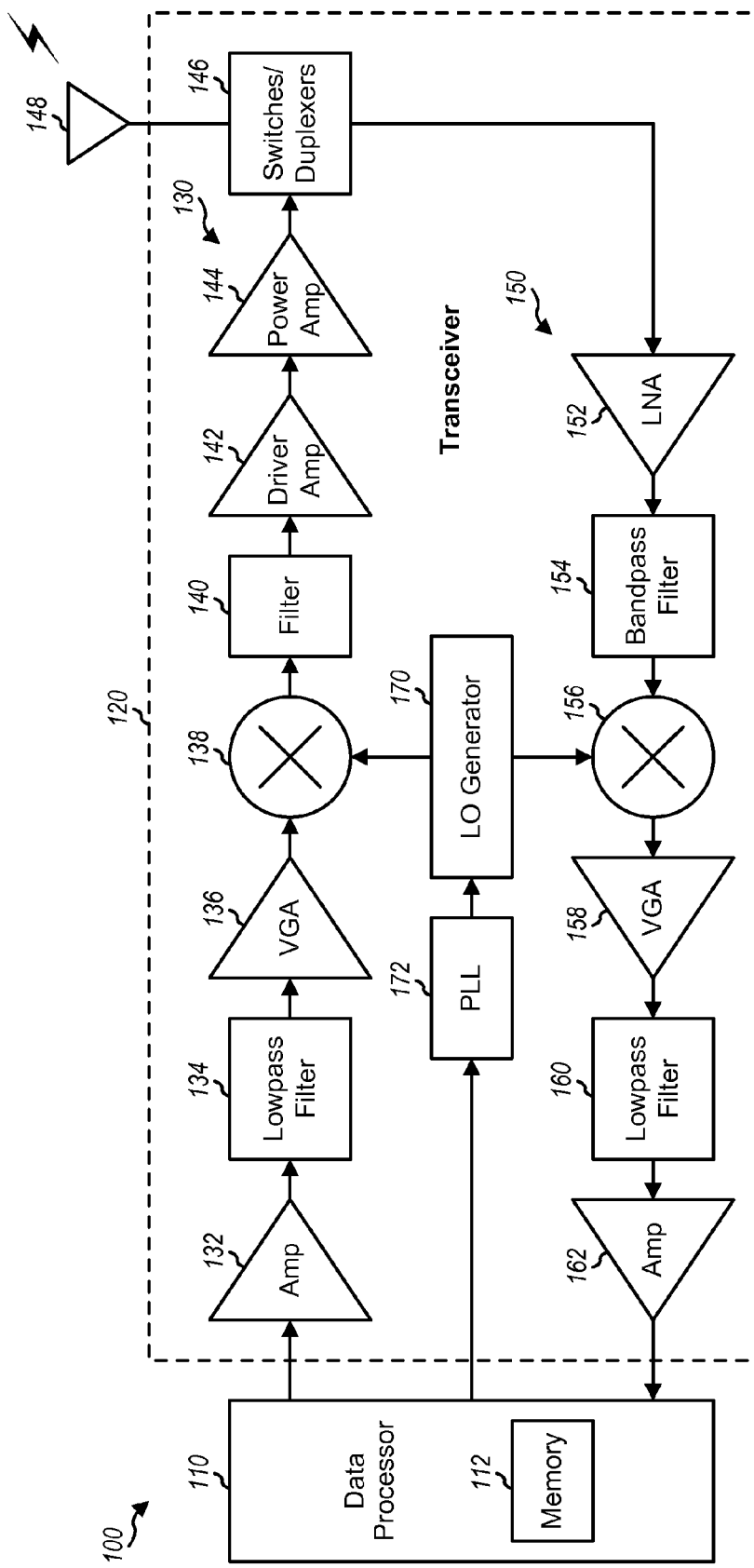
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output baseband signal to transmitter 130. Within transmitter 130, the analog output baseband signal is amplified by an amplifier (Amp) 132, filtered by a lowpass filter 134 to remove images caused by digital-to-analog conversion, amplified by a variable gain amplifier (VGA) 136, and upconverted from baseband to RF by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by a low noise amplifier (LNA) 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input baseband signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

For a power amplifier used in a wireless device, high output power as well as high power-added efficiency (PAE) are important. The power amplifier may be fabricated on an IC in order to obtain smaller size, lower cost, and other advantages. To obtain high output power and high PAE, the silicon-based power amplifier may be connected to a higher power supply voltage or possibly to a battery directly. Furthermore, to reduce cost as well as insertion loss, the power amplifier may be coupled to an antenna without going through an isolator, which is typically used to attenuate reflection signal due to load mismatch. As a result, the gate and drain of a transistor in the power amplifier may observe high peak voltage. The high peak voltage may be 3 to 4 times the power supply voltage when there is severe impedance mismatch at the output of the power amplifier. The severe load mismatch may correspond to a high voltage standing wave ratio (VSWR), e.g., VSWR of 10:1 or more. A peak detector may be used to detect for high peak voltage observed by the power amplifier so that appropriate corrective actions can be performed.

Figure 2:
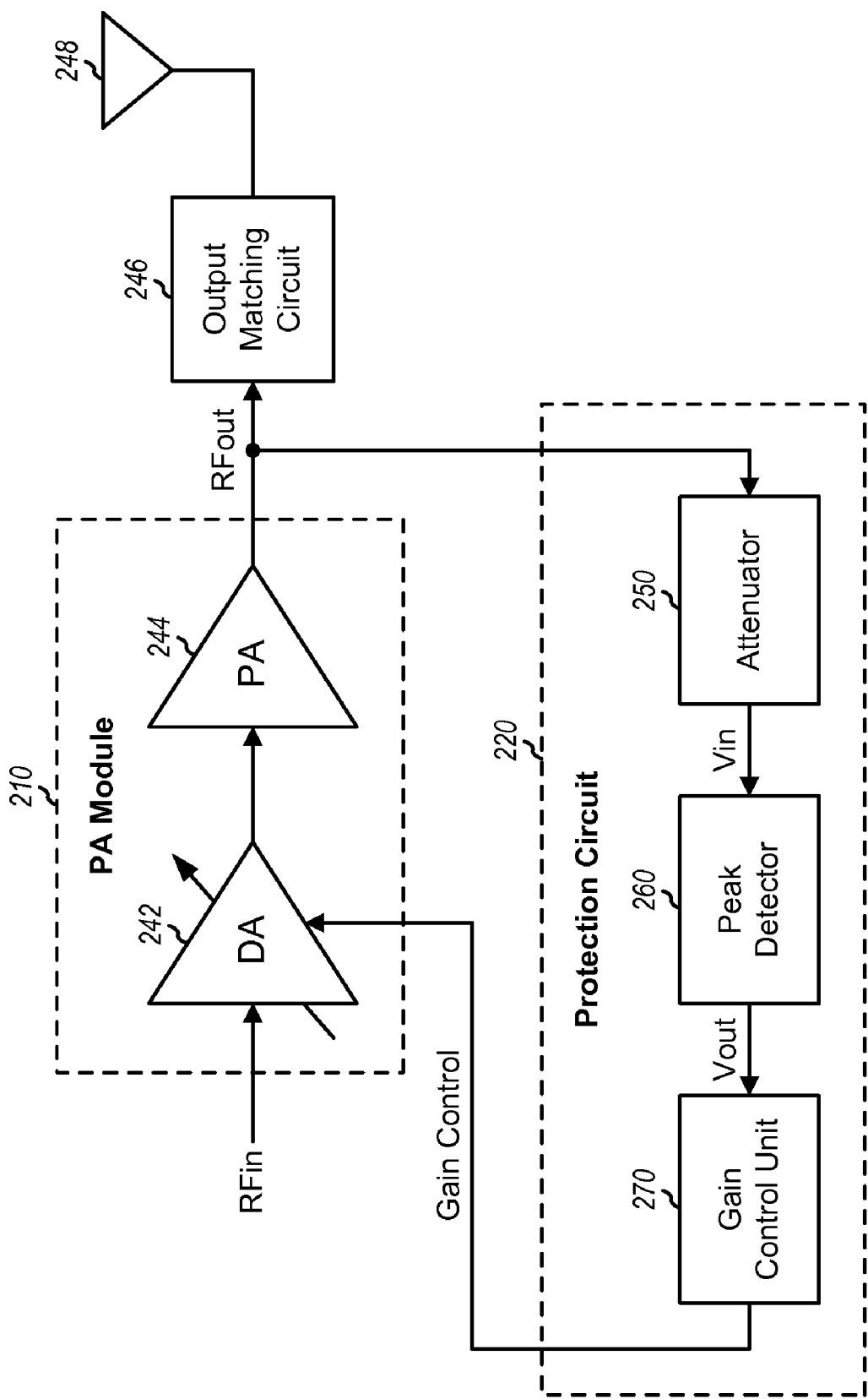
FIG. 2 shows a block diagram of a PA module and a protection circuit.

FIG. 2 shows a block diagram of a power amplifier (PA) module 210 and a protection circuit 220 to limit peak voltage. PA module 210 includes a driver amplifier (DA) 242 and a power amplifier 244, which may correspond to driver amplifier 142 and power amplifier 144 in FIG. 1. Driver amplifier 242 receives and amplifies an input RF (RFin) signal with a configurable gain and provides an intermediate RF signal. Power amplifier 244 further amplifies the intermediate RF signal and provides an output RF (RFout) signal. A matching circuit 246 performs output impedance matching for power amplifier 244 and is coupled between power amplifier 244 and an antenna 248. Matching circuit 246 may match a low output impedance (e.g., 2 to 4 Ohms) of power amplifier 244 to a moderate impedance (e.g., 50 Ohms) of antenna 248.

Protection circuit 220 limits the peak voltage at the output of power amplifier 244 and protects the transistors in power amplifier 244 from breakdown. Protection circuit 220 may also be referred to as a VSWR protection circuit, a PA protection circuit, etc. Within protection circuit 220, an attenuator 250 receives the RFout signal from power amplifier 244 and provides a peak detector input (Vin) signal, which may be an attenuated version of the RFout signal. A peak detector 260 detects for peak voltage of the Vin signal and provides a peak detector output (Vout) signal indicative of the detected peak voltage. A gain control unit 270 receives the Vout signal from peak detector 260 and generates a gain control signal based on the Vout signal. The gain of driver amplifier 242 is adjusted by the gain control signal.

As shown in FIG. 2, PA module 210 and protection circuit 220 are coupled in a negative feedback loop. Protection circuit 220 senses the peak voltage of the RFout signal and reduces the gain of driver amplifier 242 when high peak voltage is detected. The reduced gain of driver amplifier 242 would reduce the amplitude of the RFout signal, which would in turn reduce the peak voltage. Protection circuit 220 in the feedback loop can thus reduce and limit the peak voltage of the RFout signal by reducing the gain of driver amplifier 242.

In one exemplary design, gain control unit 270 includes an error amplifier that determines an error between the Vout signal from peak detector 260 and a reference voltage and generates the gain control signal based on the error. The error amplifier reduces the gain of driver amplifier 242 when the peak voltage exceeds a predetermined level, which is set by the reference voltage.

In another exemplary design, gain control unit 270 includes a set of comparators that compares the Vout signal from peak detector 260 against a set of reference voltages and provides a set of digital comparator output signals. A digital circuit then processes the comparator output signals and generates the gain control signal for driver amplifier 242. The gain control signal may be generated with hysteresis to avoid toggling between two output power levels when high peak voltage is detected. The gain of driver amplifier 242 may be reduced when the RFout signal exceeds a high threshold. This would then cause the RFout signal to decrease in amplitude. However, the gain of driver amplifier 242 may be increased only when the RFout signal falls below a low threshold, which may be set lower than the high threshold by a hysteresis amount. The hysteresis may avoid toggling of the gain due to ringing in the RFout signal envelope when the gain is changed. The hysteresis may further allow protection circuit 220 to handle amplitude modulation on the RFout signal.

Figure 3:
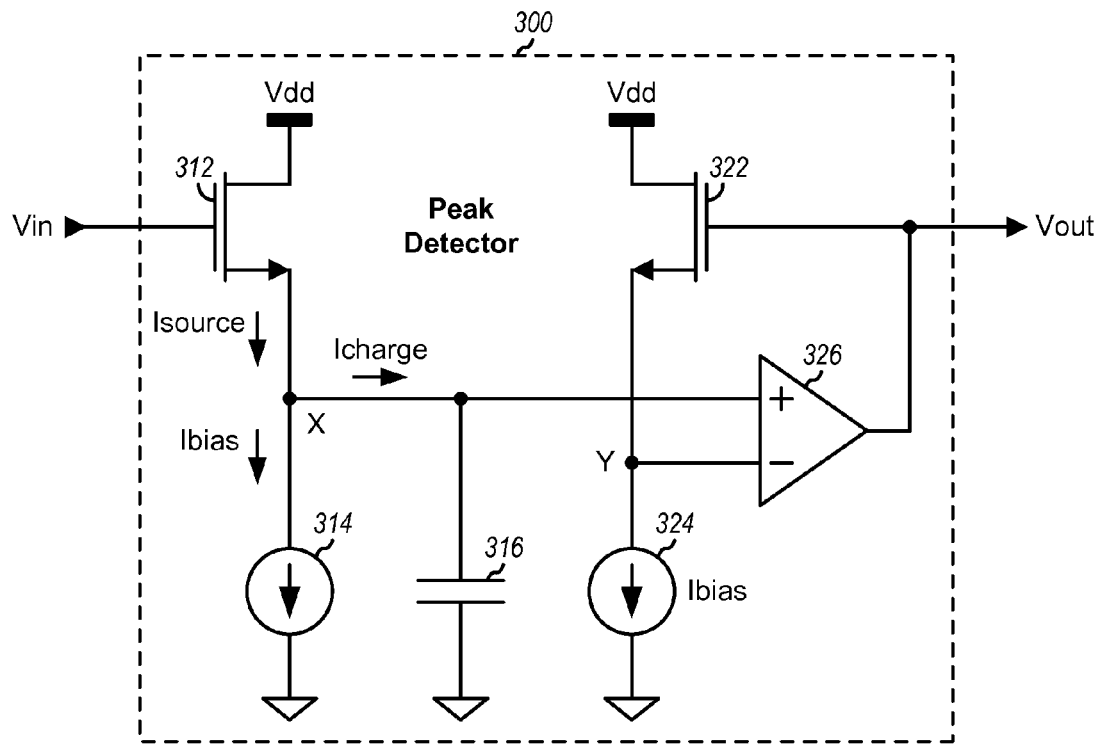
FIG. 3 shows a peak detector with fixed bias current and fixed bias voltage.

FIG. 3 shows a schematic diagram of a peak detector 300, which may be used for peak detector 260 in FIG. 2. Within peak detector 300, an N-channel metal oxide semiconductor (NMOS) transistor 312 has its gate receiving the Vin signal, its source coupled to node X, and its drain coupled to a power supply (Vdd). A current source 314 and a capacitor 316 are coupled in parallel and between node X and circuit ground. An NMOS transistor 322 has its gate coupled to the output of peak detector 300, its source coupled to node Y, and its drain coupled to the Vdd supply. A current source 324 is coupled between node Y and circuit ground. An operational amplifier (op-amp) 326 has its non-inverting input coupled to node X, its inverting input coupled to node Y, and its output coupled to the gate of NMOS transistor 322. Current sources 314 and 324 each provide a fixed current of Ibias.

Peak detector 300 operates as follows. NMOS transistor 312 acts as a rectifying forward-biased diode in the presence of the Vin signal and commutates charge onto capacitor 316 to obtain a positive rectified voltage. To make the charge transfer bi-directional for capacitor 316, current source 314 acts as a constant current sink such that peak detector 300 can respond to a time-varying waveform. The Vin signal may include a continuum of modulation frequencies within the system bandwidth. The capacitance of capacitor 316 and the bias current of current source 314 may be selected such that the highest amplitude and the fastest rate of change of voltage (dv/dt) of an envelope on the Vin signal can be followed and tracked. The resulting detected voltage on capacitor 316 is provided to high input impedance op-amp 326 to prevent charge leakage from capacitor 316.

The detected voltage at node X is equal to the voltage at the gate of NMOS transistor 312 minus a gate-to-source voltage (Vgs) of NMOS transistor 312. Op-amp 326 is connected in a negative feedback loop and sets the gate voltage of NMOS transistor 322 such that the voltage at node Y matches the voltage at node X. The gate voltage of NMOS transistor 322 should match the gate voltage of NMOS transistor 312 since NMOS transistor 322 and current source 324 are replicas of NMOS transistor 312 and current source 314. NMOS transistor 322 thus compensates for the Vgs voltage of NMOS transistor 312.

Figure 4:
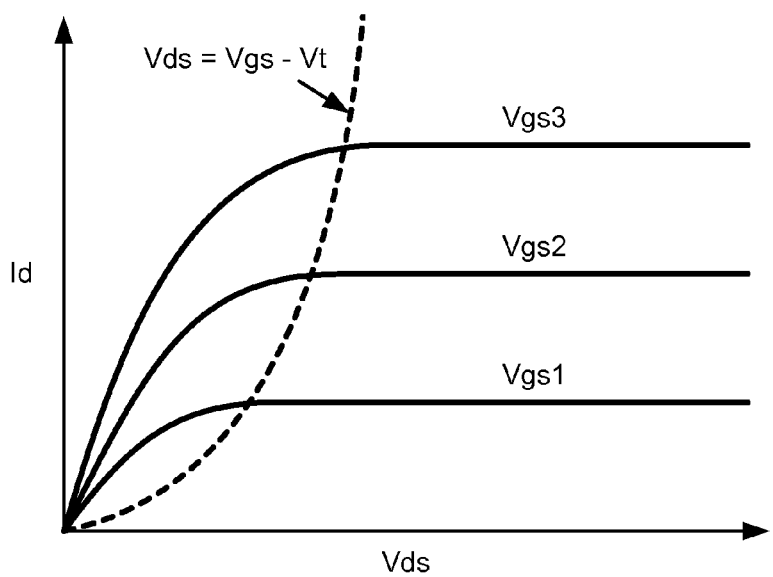
FIG. 4 shows a family of curves for drain current versus drain-to-source voltage.

FIG. 4 shows a family of curves for drain current (Id) versus drain-to-source voltage (Vds) of an NMOS transistor. A curve of Id versus Vds may be drawn for a given Vgs voltage. This curve shows the Id current increasing with the Vds voltage until a knee in the curve is reached. After the knee, the Id current flattens to a final value (ideally) and does not increase as the Vds voltage is increased. FIG. 4 shows three curves for three different Vgs voltages of Vgs1, Vgs2 and Vgs3. As shown in FIG. 4, the curves for progressively higher Vgs voltages have progressively larger final values of the Id current.

Referring back to FIG. 3, NMOS transistor 312 provides a source current of Isource. The source current includes (i) a DC component that is determined by the bias current from current source 314 and the bias voltage applied at the gate of NMOS transistor 312, which is not shown in FIG. 3, and (ii) a dynamic component that is determined by the Vin signal. A charge current of Icharge is equal to the source current from NMOS transistor 312 minus the bias current from current source 314. Capacitor 316 is charged by the charge current when the source current is greater than the bias current and is discharged by the charge current when the source current is less than the bias current. The charging speed of capacitor 316 should be sufficiently fast to allow the peak detector to track a large fast rising Vin signal, so that corrective actions can be taken, if needed, to prevent damage to the power amplifier. Capacitor 316 should not be too small in order to limit ripple in the Vout signal.

Peak detector 300 can detect the peak voltage of the Vin signal but may have some drawbacks. In particular, peak detector 300 may suffer from low speed, poor accuracy, and poor linearity due to nonlinear voltage and current characteristics between the gate and source of NMOS transistor 312, as shown in FIG. 4. A tradeoff between speed, accuracy, and linearity may be made by selecting an appropriate value for the bias current. To detect for a large fast rising Vin signal, the source current from NMOS transistor 312 should be large, and all of the source current should be used to charge capacitor 316. However, as shown in FIG. 3, a portion of the source current is provided as the bias current, and the remaining portion is provided as the charge current. In this case, the bias current should be small (but not too small since this would limit the speed of NMOS transistor 312). Conversely, to follow a fast falling Vin signal, the source current from NMOS transistor 312 should vanish quickly, and the bias current should be reasonably large to quickly discharge capacitor 316. Unfortunately, it may be difficult or not possible to obtain the desired behavior described above for both large fast rising and falling Vin signal using a fixed bias current and an NMOS transistor with a fixed bias voltage.

In an aspect, a variable bias current may be used instead of a fixed bias current in order to improve detection performance for large fast rising and falling Vin signal. In an exemplary design, the magnitude of the bias current may be dependent on the Vin signal. In particular, a smaller bias current may be provided for a larger Vin signal, and vice versa. This may improve both charging speed when the Vin signal rises and discharging speed when the Vin signal falls.

Figure 5:
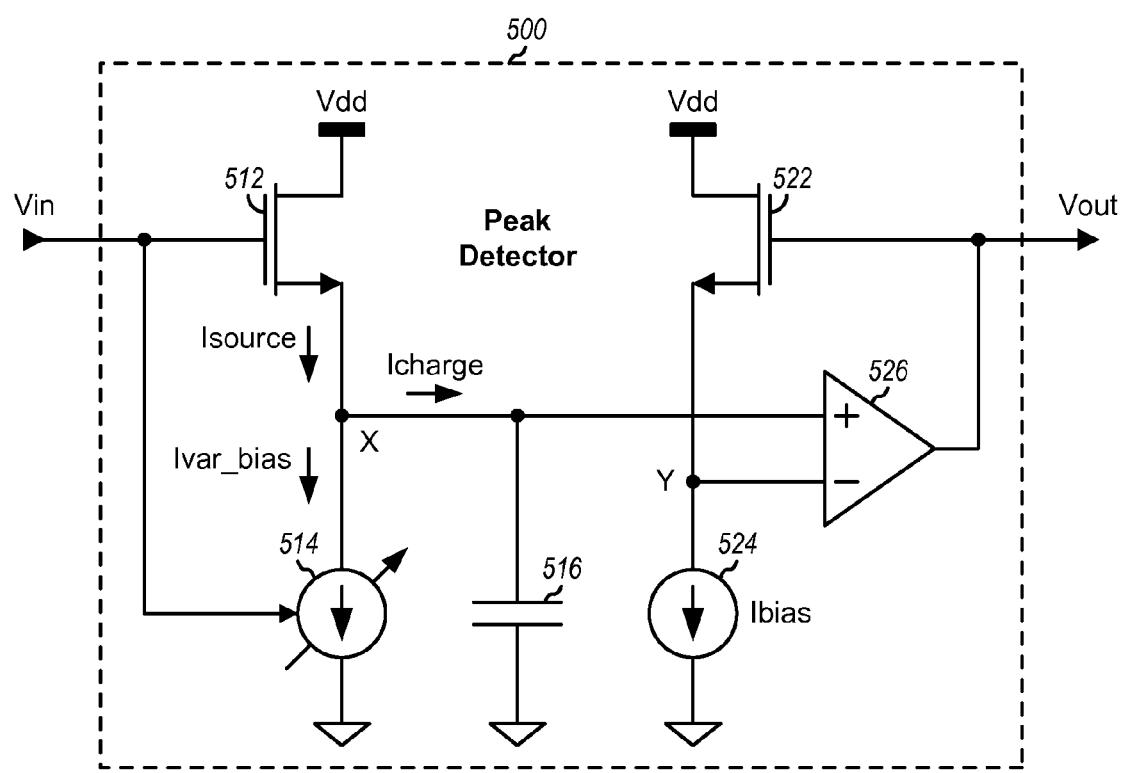
FIG. 5 shows a peak detector with variable bias current.

FIG. 5 shows a schematic diagram of an exemplary design of a high linear fast peak detector 500 with a variable bias current. Within peak detector 500, an NMOS transistor 512 has its gate receiving the Vin signal, its source coupled to node X, and its drain coupled to the Vdd supply. A variable current source 514 and a capacitor 516 are coupled in parallel and between node X and circuit ground. An NMOS transistor 522 has its gate coupled to the output of peak detector 500, its source coupled to node Y, and its drain coupled to the Vdd supply. A current source 524 is coupled between node Y and circuit ground. An op-amp 526 has its non-inverting input coupled to node X, its inverting input coupled to node Y, and its output coupled to the gate of NMOS transistor 522. Current source 524 provides a fixed current of Ibias.

In the exemplary design shown in FIG. 5, current source 514 receives the Vin signal and provides a variable bias current of Ivar_bias. The bias current may be inversely proportional to the Vin voltage. Hence, current source 514 may provide a smaller bias current for a larger Vin signal, and vice versa. When the Vin signal goes high, NMOS transistor 512 provides a large source current due to the high Vin signal. Since the bias current is small when the Vin signal is high, most of the source current charges capacitor 516, and only a small portion of the source current is provided as the bias current. The source current from NMOS transistor 512 may thus have a pulse-like response and may allow peak detector 500 to catch a fast rising Vin signal. Conversely, when the Vin signal goes low, NMOS transistor 512 provides a small or zero source current due to the low Vin signal. The bias current is larger when the Vin signal is low and can more quickly discharge capacitor 516.

Reducing the bias current when the Vin signal goes high can improve charging speed for capacitor 516 since more of the source current can be used to charge capacitor 516. The speed at which capacitor 516 can be charged is then dependent on the magnitude of the source current. A larger source current can more quickly charge capacitor 516 and can allow the peak detector to track a large fast rising Vin signal. A larger source current may be obtained with a larger NMOS transistor 512. However, the larger NMOS transistor 512 would increase loading on the Vin signal, which may be undesirable.

In another aspect, the biasing of an NMOS transistor may be varied via a feedback circuit to enable the NMOS transistor to provide a variable source current, which may improve detection performance for a large fast rising Vin signal. The feedback circuit may generate a variable bias voltage for the NMOS transistor based on the envelope of the Vin signal. In particular, the feedback circuit may generate the variable bias voltage such that the NMOS transistor can provide a larger source current for a larger Vin signal amplitude and a smaller source current for a smaller Vin signal amplitude. This may improve charging speed when the Vin signal rises.

Figure 6:
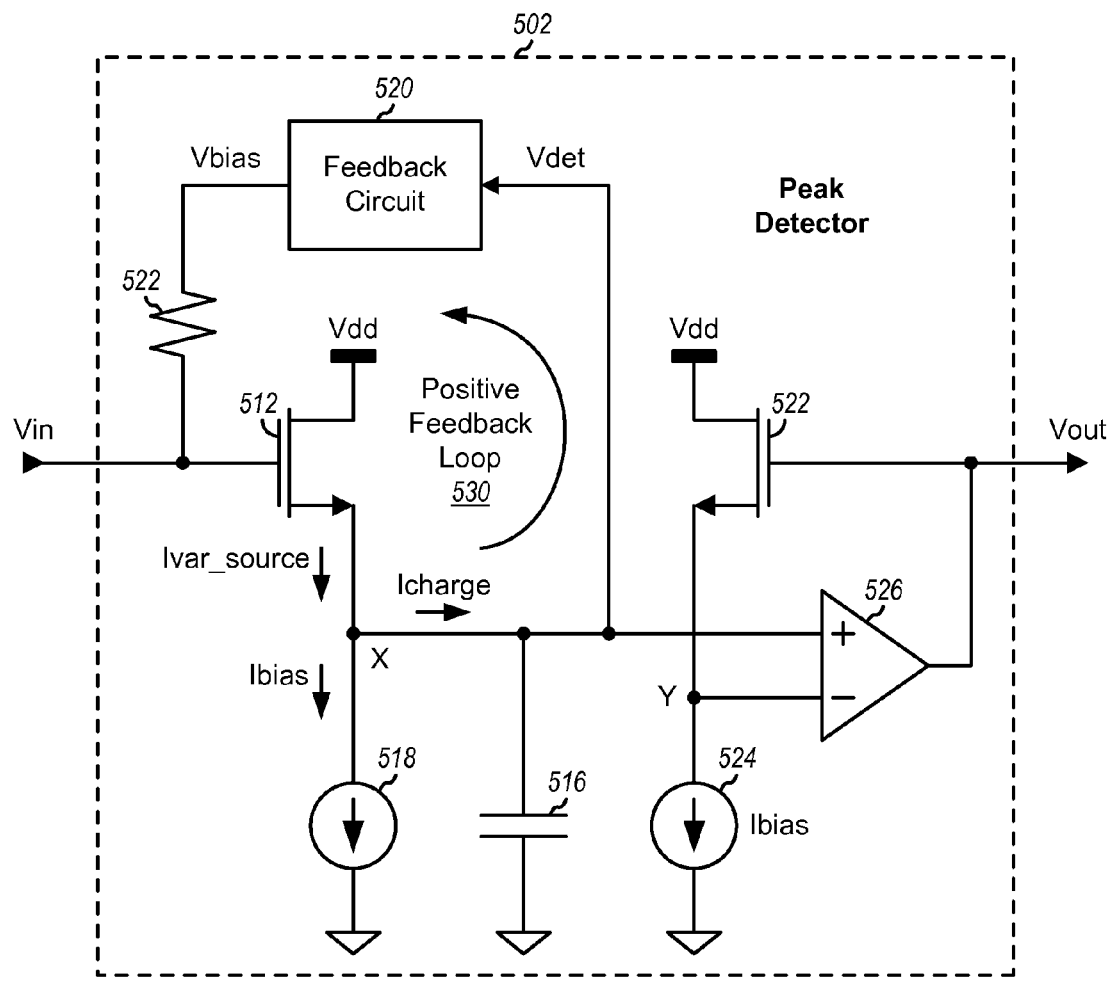
FIG. 6 shows a peak detector with variable bias voltage.

FIG. 6 shows a schematic diagram of an exemplary design of a high linear fast peak detector 502 with a variable bias voltage. Peak detector 502 includes NMOS transistors 512 and 522, capacitor 516, current source 524, and op-amp 526, which are coupled as described above for peak detector 500 in FIG. 5. Peak detector 502 further includes a fixed current source 518, a feedback circuit 520, and a resistor 522. Fixed current source 518 replaces variable current source 514 in FIG. 5. Feedback circuit 520 has its input coupled to node X and its output coupled to one end of resistor 522. The other end of resistor 522 is coupled to the gate of NMOS transistor 512.

In the exemplary design shown in FIG. 6, feedback circuit 520 receives a detected voltage (Vdet) at node X and provides a variable bias voltage (Vbias) to the gate of NMOS transistor 512 via resistor 522. The bias voltage may be related to (e.g., proportional to) the detected voltage. NMOS transistor 512 provides a variable source current (Ivar_source) that is dependent on the variable bias voltage. In particular, NMOS transistor 512 provides a larger source current for a larger bias voltage and provides a smaller source current for a smaller bias voltage. When the Vin signal goes high, the source current from NMOS transistor 512 charges capacitor 516, and the detected voltage rises. The higher detected voltage causes the bias voltage to increase, which then results in a larger source current that improves charging speed and allows peak detector 502 to follow a large fast rising Vin signal. Conversely, when the Vin signal goes low, the source current from NMOS transistor 512 reduces to a low value. Capacitor 516 is discharged by the bias current from current source 518, and the detected voltage falls. The lower detected voltage causes the bias voltage to decrease, which then results in a smaller source current. The variable source current may thus allow peak detector 502 to more accurately detect a large fast rising Vin signal while minimally impacting detection of a falling Vin signal.

Feedback circuit 520 and NMOS transistor 512 form a positive feedback loop 530 that can increase both the transconductance/gain and the source current of NMOS transistor 512, particularly with respect to a large and fast Vin signal. The positive feedback loop bootstraps the bias voltage at the gate of NMOS transistor 512 and forces NMOS transistor 512 to conduct more with increasing Vin signal. The positive feedback loop may be designed to have a loop bandwidth that is slow relative to the RF frequency of the RFout signal but fast relative to the envelope of the RFout signal. For example, the RF frequency may be several gigahertz (GHz), the envelope of the RFout signal may be several megahertz (MHz), and the loop bandwidth of the positive feedback loop may be several MHz. The positive feedback loop may also be designed with a low loop gain of less than one (e.g., with a loop gain of 0.2 to 0.5) in order to avoid saturation of NMOS transistor 512 and to ensure a stable response.

Figure 7:
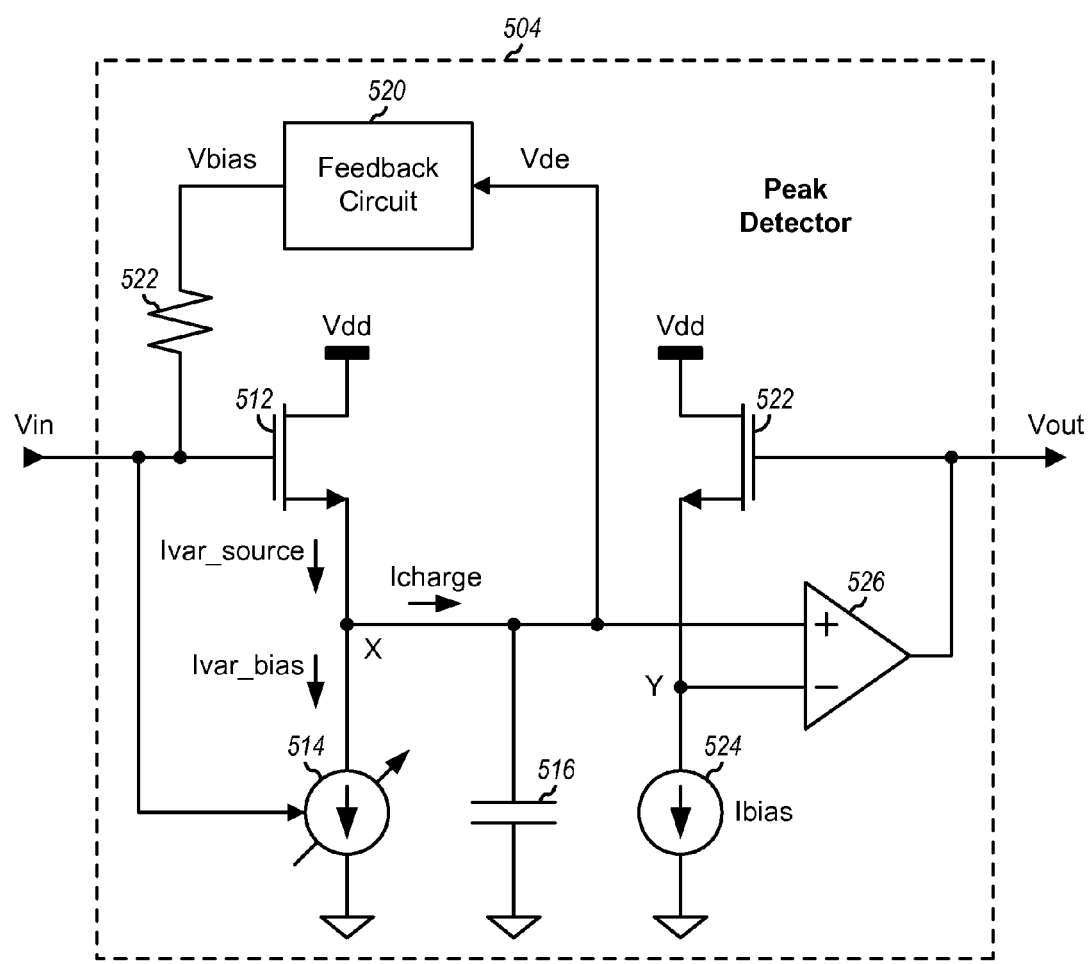
FIG. 7 shows a peak detector with variable bias current and variable bias voltage.

FIG. 7 shows a schematic diagram of an exemplary design of a high linear fast peak detector 504 with a variable bias current and a variable bias voltage. Peak detector 504 includes all of the circuit components in peak detector 500 in FIG. 5. Peak detector 504 further includes feedback circuit 520 and resistor 522, which are coupled as described above for peak detector 502 in FIG. 6.

Peak detector 504 can provide improved charging and discharging speed due to the use of (i) variable current source 514 to provide a variable bias current (Ivar_bias) and (ii) a positive feedback loop to enable NMOS transistor 512 to provide a variable source current (Ivar_source). When the Vin signal goes high, a combination of a larger source current and a smaller bias current allows capacitor 516 to be charged more quickly. Conversely, when the Vin signal goes low, a combination of a smaller source current and a larger bias current allows capacitor 516 to be discharged more quickly.

Variable current source 514 in FIGS. 5 and 7 and feedback circuit 520 in FIGS. 6 and 7 may be implemented in various manners. It may be desirable to implement current source 514 and feedback circuit 520 such that these circuits do not cause excessive loading on the Vin signal.

Figure 8:
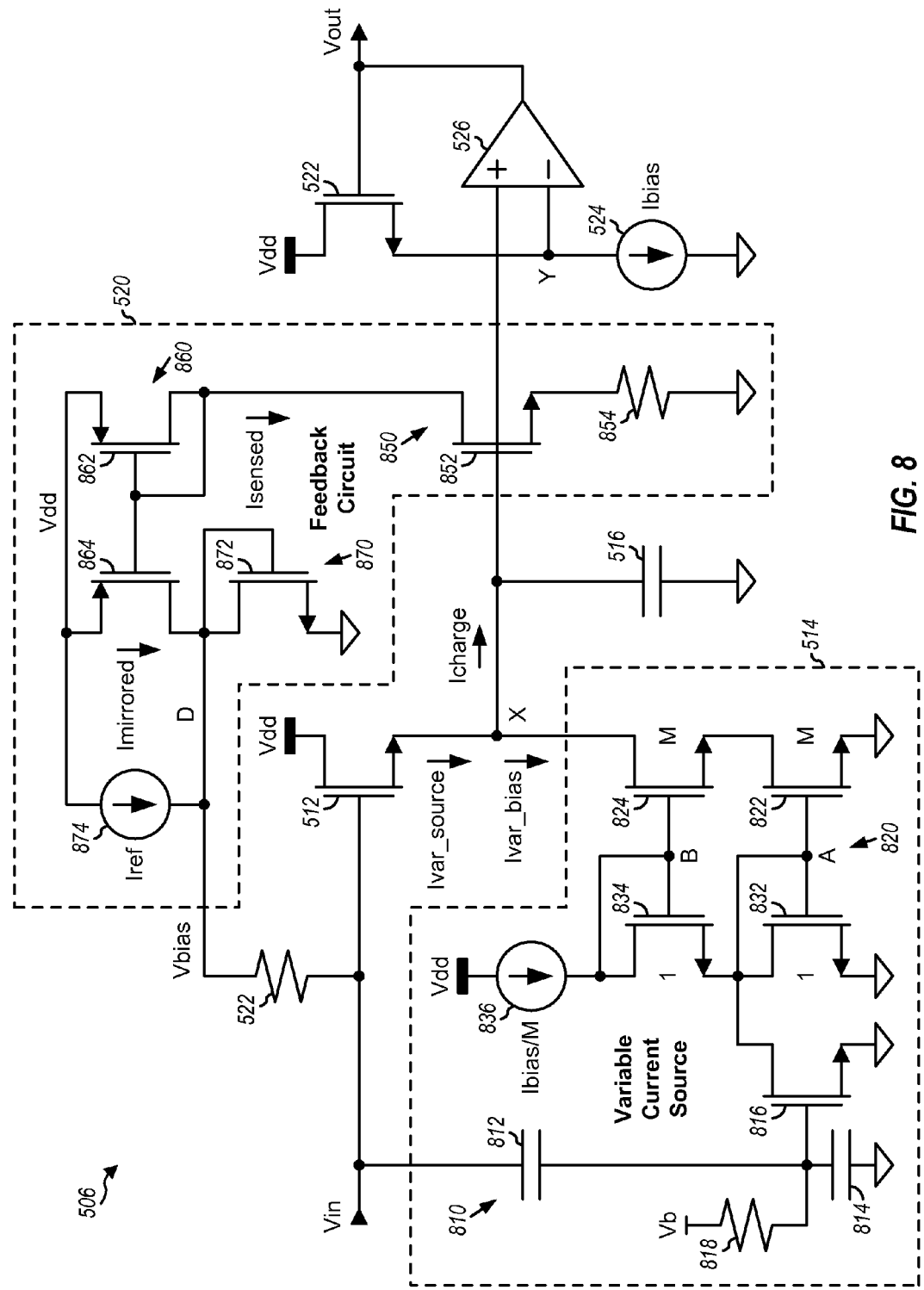
FIG. 8 shows a peak detector with a variable current source and a feedback circuit.

FIG. 8 shows a schematic diagram of an exemplary design of a high linear fast peak detector 506 with a variable bias current and a variable bias voltage. Peak detector 506 includes all of the circuit components in peak detector 504 in FIG. 7. Peak detector 506 includes an exemplary design of variable current source 514 and an exemplary design of feedback circuit 520.

Variable current source 514 includes a voltage divider 810, a control transistor 816, and a current mirror 820. Voltage divider 810 is implemented with capacitors 812 and 814, which are coupled in series and between the gate of NMOS transistor 512 and circuit ground. Control transistor 816 is implemented with an NMOS transistor having its source coupled to circuit ground, its gate coupled to the common node between capacitors 812 and 814, and its drain coupled to node A. A resistor 818 has one end coupled to the gate of NMOS transistor 816 and the other end receiving a bias voltage (Vb).

Current mirror 820 is implemented with NMOS transistors 822, 824, 832 and 834 and a current source 836. NMOS transistors 822 and 824 are coupled in a stack. NMOS transistor 822 has its source coupled to circuit ground and its gate coupled to node A. NMOS transistor 824 has its source coupled to the drain of NMOS transistor 822, its gate coupled to node B, and its drain coupled to node X. NMOS transistors 832 and 834 are also coupled in a stack. NMOS transistor 832 has its source coupled to circuit ground and its gate and drain coupled to node A. NMOS transistor 834 has its source coupled to the drain of NMOS transistor 832 and its gate and drain coupled to node B. Current source 836 is coupled between the Vdd supply and the drain of NMOS transistor 834. NMOS transistors 832 and 834 have a normalized size of 1, and NMOS transistors 822 and 824 have a size of M, where M may be one or greater. Current source 836 provides a fixed current of Ibias/M.

Feedback circuit 520 includes a sensing circuit 850, a current mirror 860, and a voltage generator 870. Sensing circuit 850 is implemented with an NMOS transistor 852 and a resistor 854. NMOS transistor 852 has its gate coupled to node X and its source coupled to one end of resistor 854. The other end of resistor 854 is coupled to circuit ground. Current mirror 860 is implemented with P-channel metal oxide semiconductor (PMOS) transistors 862 and 864, which have their sources coupled to the Vdd supply and their gates coupled together. The gate and drain of PMOS transistor 862 are coupled to the drain of NMOS transistor 852. The drain of PMOS transistor 864 is coupled to node D. Voltage generator 870 is implemented with an NMOS transistor 872 and a current source 874. NMOS transistor 872 has its source coupled to circuit ground and its gate and drain coupled to node D. Current source 874 is coupled between the Vdd supply and node D. Resistor 522 is coupled between node D and the gate of NMOS transistor 512.

Current source 514 provides a variable bias current that is inversely related to the Vin signal. Current source 514 operates as follows. Capacitors 812 and 814 operate as a voltage divider for the dynamic component of the Vin signal. Capacitor 812 receives the Vin signal, and capacitor 814 provides a control signal to the gate of NMOS transistor 816. The control signal is an attenuated version of the Vin signal.

When the Vin signal goes high, NMOS transistor 816 is turned on and pulls down the voltage at the gates of NMOS transistors 822 and 832. This causes the bias current via NMOS transistors 822 and 824 to drop and approach zero when the Vin signal reaches its peak. A small bias current is desirable in this case because more of the source current from NMOS transistor 512 can be used to charge capacitor 516. The fixed current from current source 836 passes through NMOS transistors 834 and 816 since NMOS transistor 832 is turned off in similar manner as NMOS transistor 822.

Conversely, when the Vin signal goes low, NMOS transistor 816 is turned off, and the fixed current from current source 836 flows through NMOS transistors 832 and 834. To achieve fast response, NMOS transistor 816 is not fully turned off but has a small leakage current, e.g., of 1 to 2 microamperes (µA). NMOS transistors 822 and 832 are part of current mirror 820. NMOS transistor 822 provides a current of Ibias due to a current of Ibias/M through NMOS transistor 832 and a ratio of M:1 between the sizes of NMOS transistors 822 and 832. NMOS transistors 824 and 834 operate as cascode transistors that improve current mirror accuracy and provide high output impedance at the drain of NMOS transistor 824. The bias current through NMOS transistors 822 and 824 discharges capacitor 516.

NMOS transistor 816 may be designed with a small size to reduce loading on the Vin signal. The capacitances of capacitors 812 and 814 may be selected such that NMOS transistor 816 operates mostly in a linear region for an expected voltage range of the Vin signal. In an exemplary design, capacitor 814 has a capacitance that may be 3 to 4 times larger than the capacitance of capacitor 812, and the control signal provided to NMOS transistor 816 may be one quarter to one fifth of the Vin signal. In general, the capacitance values may be selected such that (i) a high Vin signal fully turns on (but does not saturate) NMOS transistor 816 and (ii) a low Vin signal turns off (but does not completely shut off) NMOS transistor 816.

NMOS transistors 822 and 824 may provide a small bias current (which may be 0 to 10% of Ibias) when the Vin signal is high and may provide a large bias current (which may be 100% of Ibias) when the Vin signal is low. NMOS transistors 822 and 824 may be operated such that they are not completely shut off when the Vin signal is high, so that these NMOS transistors can be turned on more quickly when the Vin signal goes low. The small bias current may minimally impact the charging of capacitor 516 when the Vin signal is high. The large bias current may be set to any suitable value to obtain the desired discharging speed and the desired ripple on the detected voltage on capacitor 516. The charging current and the discharging current may be set independently for peak detector 506.

Feedback circuit 520 increases the source current from NMOS transistor 512 when the envelope of the Vin signal is high. Feedback circuit 520 operates as follows. NMOS transistor 852 and resistor 854 operate as a sensing circuit that senses the voltage at node X, which should follow the envelope of the Vin signal. NMOS transistor 852 is a source follower, and resistor 854 converts the source voltage of NMOS transistor 852 to current. When the detected voltage at node X increases, the sensed current (Isensed) through MOS transistors 862 and 862 increases. PMOS transistors 862 and 864 are coupled as a current mirror, and the mirrored current (Imirrored) through PMOS transistor 864 is proportional to the sensed current through PMOS transistor 862. NMOS transistor 872 is operated as a resistor that can track variations in IC process, power supply voltage, and temperature (PVT). The variable mirrored current from PMOS transistor 864 and a fixed reference current (Iref) from current source 874 are passed through NMOS transistor 872. The bias voltage (Vbias) includes (i) a fixed component provided by the fixed reference current and (ii) a variable component that varies in proportion to the variable mirrored current. The higher mirrored current through PMOS transistor 864 results in a higher bias voltage, which increases the transconductance/gain as well as the source current of NMOS transistor 512. Conversely, when the detected voltage at node X decreases, the sensed current decreases, the mirrored current also decreases, and the bias voltage decreases. The lower bias voltage decreases the transconductance as well as the source current of NMOS transistor 512.

FIG. 8 shows exemplary designs of variable current source 514 and feedback circuit 520. Current source 514 operates on the Vin signal at RF frequency and should be sufficiently fast while minimally loading the Vin signal. Feedback circuit 520 operates on the envelope of the Vin signal at lower frequency and should be stable. Current source 514 and feedback circuit 520 may also be implemented in other manners. For example, feedback circuit 520 may receive the Vout signal instead of the detected signal.

Figure 9:
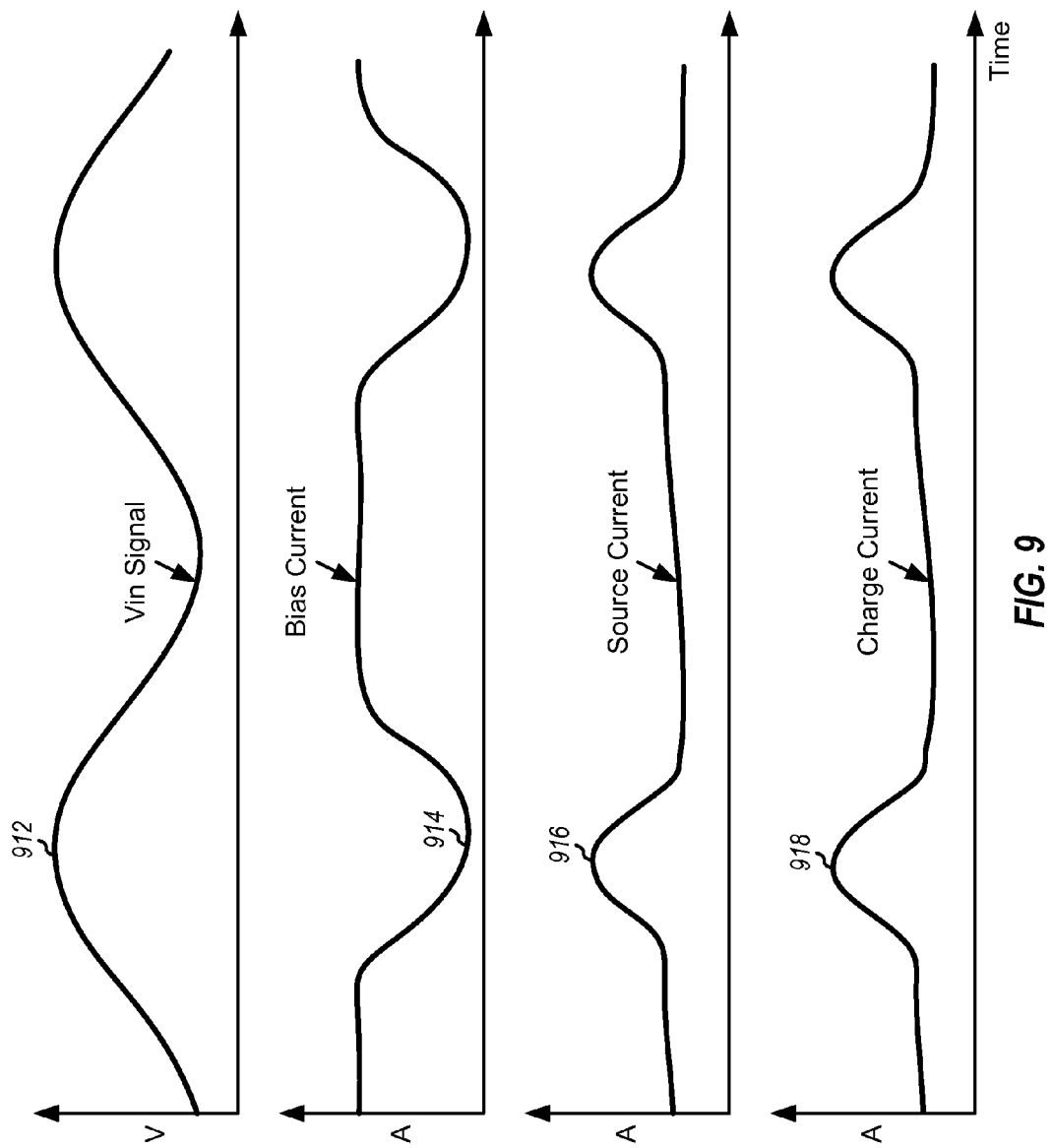
FIG. 9 shows plots of various signals in the peak detector in FIG. 8.

FIG. 9 shows plots of various signals in peak detector 506 in FIG. 8. In FIG. 9, the horizontal axis denotes time, and the vertical axis denotes voltage (V) or current (A). FIG. 9 shows a plot 912 of the Vin signal, a plot 914 of the variable bias current from current source 514, a plot 916 of the source current from NMOS transistor 512, and a plot 918 of the charge current for capacitor 516. As shown in FIG. 9, when the Vin signal goes high, the bias current decreases, the source current increases, and the charge current increases. Conversely, when the Vin signal goes low, the bias current increases, the source current decreases, and the charge current goes negative. The currents in FIG. 9 are not shown to scale. The peak bias current may be a fraction of the peak source current.

Figure 10:
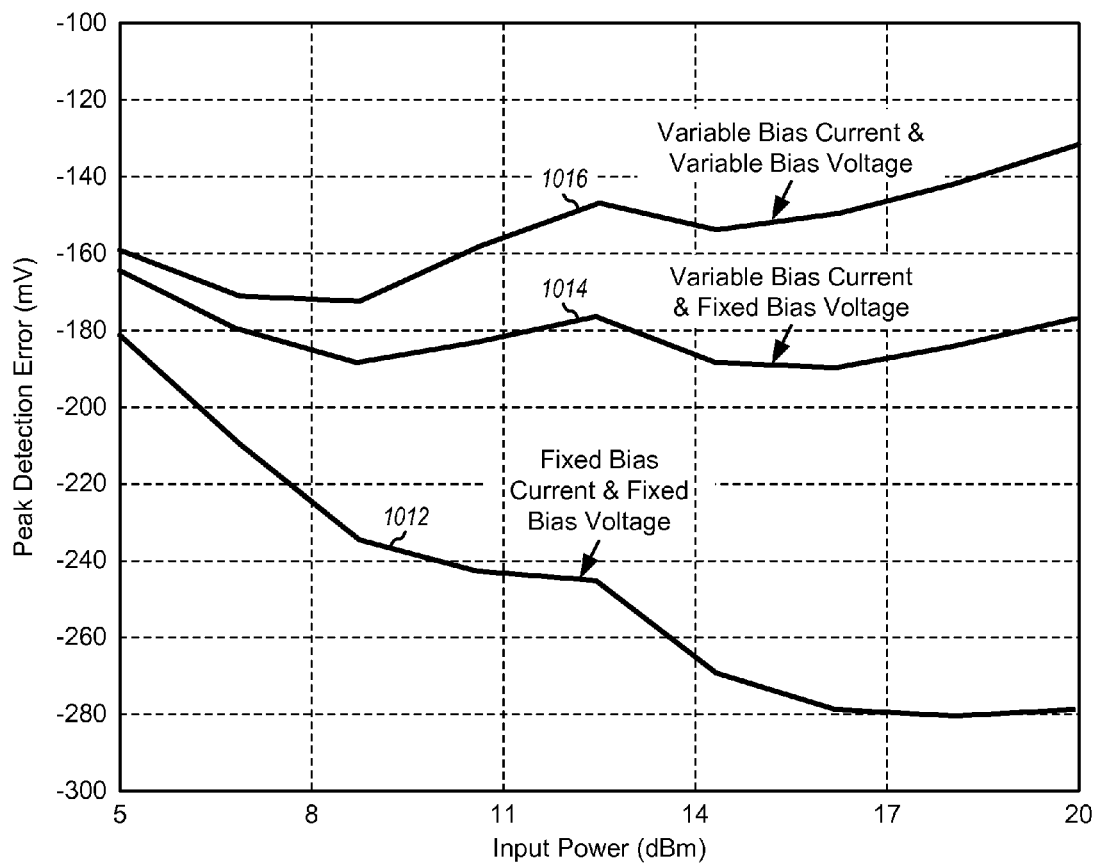
FIG. 10 shows plots of peak detection errors for different peak detectors.

FIG. 10 shows plots of peak detection errors for different peak detectors described herein. In FIG. 10, the horizontal axis denotes transmit power of the RFin signal in units of dBm. The vertical axis denotes peak detection error, which is the error between the Vout signal from a peak detector and the peak Vin signal provided to the peak detector. A plot 1012 shows peak detection error for peak detector 300 in FIG. 3, which has a fixed bias current and a fixed bias voltage. A plot 1014 shows peak detection error for peak detector 500 in FIG. 5, which has a variable bias current and a fixed bias voltage. A plot 1016 shows peak detection error for peak detector 504 in FIG. 7, which has a variable bias current and a variable bias voltage. As shown in FIG. 10, peak detection error may be substantially reduced by use of variable bias current and variable bias voltage described herein.

The high linear fast peak detector described herein may provide certain advantages. First, the peak detector may have better accuracy with the variable bias current. Second, the peak detector may have better linearity with the variable bias current and the variable bias voltage provided by positive feedback. Third, the peak detector may have enhanced capability to capture large sharp voltage peaks. Fourth, the peak detector may have less sensitivity due to PVT variations. The peak detector may also have other advantages.

In an exemplary design, an apparatus (e.g., an integrated circuit, a wireless device, etc.) may include a peak detector that may receive an input signal, provide an output signal, and have adaptive bias. The peak detector may include a transistor and a capacitor. The transistor may receive the input signal, provide a source current, and have an adaptive bias. The capacitor may be coupled to the transistor and may be charged by the source current, e.g., when the input signal is high. In an exemplary design, the transistor may have an adaptive bias current generated based on feed forward of the input signal, e.g., as shown in FIGS. 5, 7 and 8. In another exemplary design, the transistor may have an adaptive bias voltage generated based on feed back of a detected signal from the capacitor, e.g., as shown in FIGS. 6, 7 and 8. In yet another exemplary design, the transistor may have (i) an adaptive bias current generated based on feed forward of the input signal and (ii) an adaptive bias voltage generated based on feed back of the detected signal from the capacitor, e.g., as shown in FIGS. 7 and 8.

In another exemplary design, an apparatus may include a peak detector that may receive an input signal, provide an output signal, and have a variable bias current. The peak detector may include a first transistor, a variable current source, and a capacitor, e.g., as shown in FIG. 5. The first transistor (e.g., NMOS transistor 512 in FIG. 5) may receive the input signal and provide a source current. The variable current source (e.g., current source 514) may be coupled to the first transistor, may receive the input signal, and may provide a variable bias current based on the input signal. The variable current source may provide a low bias current when the input signal is high and may provide a high bias current when the input signal is low. The capacitor (e.g., capacitor 516) may be coupled to the first transistor and the variable current source, may be charged by the source current when the input signal is high, and may be discharged by the variable bias current when the input signal is low.

In an exemplary design, the variable current source may include a current mirror and a second transistor. The current mirror (e.g., current mirror 820 in FIG. 8) may provide the variable bias current and may be formed by NMOS transistors 822 and 832 in FIG. 8. The current mirror may be enabled when the input signal is low and may be disabled when the input signal is high. The second transistor (e.g., NMOS transistor 816) may be coupled to the current mirror and may enable or disable the current mirror based on the input signal. The second transistor may have a smaller size than the first transistor to reduce loading on the input signal. The second transistor may receive a control signal generated based on the input signal and may control a third transistor (e.g., NMOS transistor 822). The third transistor may provide a high bias current when the input signal is low and may provide a low bias current when the input signal is high. A voltage divider (e.g., voltage divider 810) may receive the input signal and provide the control signal to the second transistor. The control signal may be a fraction of the input signal and may avoid fully turning off the second transistor as well as clipping of the input signal by the second transistor.

In another exemplary design, an apparatus may include a peak detector that may receive an input signal, provide an output signal, and have a variable bias voltage. The peak detector may include a first transistor, a capacitor, and a feedback circuit, e.g., as shown in FIG. 6. The first transistor (e.g., NMOS transistor 512 in FIG. 6) may receive the input signal and provide a source current. The capacitor (e.g., capacitor 516) may be coupled to the first transistor and may be charged by the source current when the input signal is high. The feedback circuit (e.g., feedback circuit 520) may be coupled to the first transistor, may receive a detected signal indicative of an envelope of the input signal, and may provide a variable bias voltage for the first transistor. The feedback circuit may provide a higher bias voltage when the envelope of the input signal is high and may provide a lower bias voltage when the envelope of the input signal is low. The first transistor may provide a higher source current with the higher bias voltage and may provide a lower source current with the lower bias voltage.

The feedback circuit and the first transistor may be coupled in a positive feedback loop. The positive feedback loop may have a loop gain of less than one to ensure stability and a loop bandwidth of less than the center frequency of the input signal.

In an exemplary design, the feedback circuit may include a sensing circuit, a current mirror, and a voltage generator. The sensing circuit (e.g., sensing circuit 850) may be coupled to the first transistor, may sense a source voltage of the first transistor, and may provide a sensed current based on the source voltage. The current mirror (e.g., current mirror 860) may be coupled to the sensing current, may receive the sensed current, and may provide a mirrored current. The voltage generator (e.g., voltage generator 870) may be coupled to the current mirror and may generate the variable bias voltage for the first transistor based on the mirrored current.

In an exemplary design, the sensing circuit may include a second transistor and a resistor. The second transistor (e.g., NMOS transistor 852 in FIG. 8) may be coupled to the first transistor and may receive the source voltage of the first transistor. The resistor (e.g., resistor 854) may be coupled to the second transistor and may convert a source voltage of the second transistor to the sensed current. In an exemplary design, the voltage generator may include a current source and a third transistor. The current source (e.g., current source 874) may provide a reference current. The third transistor (e.g., NMOS transistor 872) may be operated as a resistor, may receive the mirrored current and the reference current, and may provide the variable bias voltage.

In yet another exemplary design, an apparatus may include a peak detector that may receive an input signal, provide an output signal, and have a variable bias current and a variable bias voltage. The peak detector may include a first transistor, a variable current source, a capacitor, and a feedback circuit, e.g., as shown in FIG. 7. The first transistor (e.g., NMOS transistor 512 in FIG. 7) may receive the input signal and provide a source current. The variable current source (e.g., current source 514) may be coupled to the first transistor, may receive the input signal, and may provide a variable bias current based on the input signal. The capacitor (e.g., capacitor 516) may be coupled to the first transistor and the variable current source, may be charged by the source current when the input signal is high, and may be discharged by the variable bias current when the input signal is low. The feedback circuit may be coupled to the first transistor, may receive a detected signal indicative of an envelope of the input signal, and may provide a variable bias voltage for the first transistor.

The variable current source may provide a low bias current when the input signal is high and may provide a high bias current when the input signal is low. This may improve charging performance. The feedback circuit (e.g., feedback circuit 520) may provide a higher bias voltage when the envelope of the input signal is high and may provide a lower bias voltage when the envelope of the input signal is low. The first transistor may provide a higher source current with the higher bias voltage and may provide a lower source current with the lower bias voltage. This may also improve charging performance.

In an exemplary design, the variable current source may include a current mirror and a second transistor. The current mirror (e.g., current mirror 820 in FIG. 8) may provide the variable bias current. The second transistor (e.g., NMOS transistor 816) may be coupled to the current mirror, may enable the current mirror when the input signal is low, and may disable the current mirror when the input signal is high.

In an exemplary design, the feedback circuit may include a sensing circuit and a voltage generator. The sensing circuit (e.g., sensing circuit 850) may be coupled to the first transistor, may sense a source voltage of the first transistor, and may provide a sensed current based on the source voltage. The voltage generator (e.g., voltage generator 870) may generate the variable bias voltage for the first transistor based on the sensed current.

Figure 11:
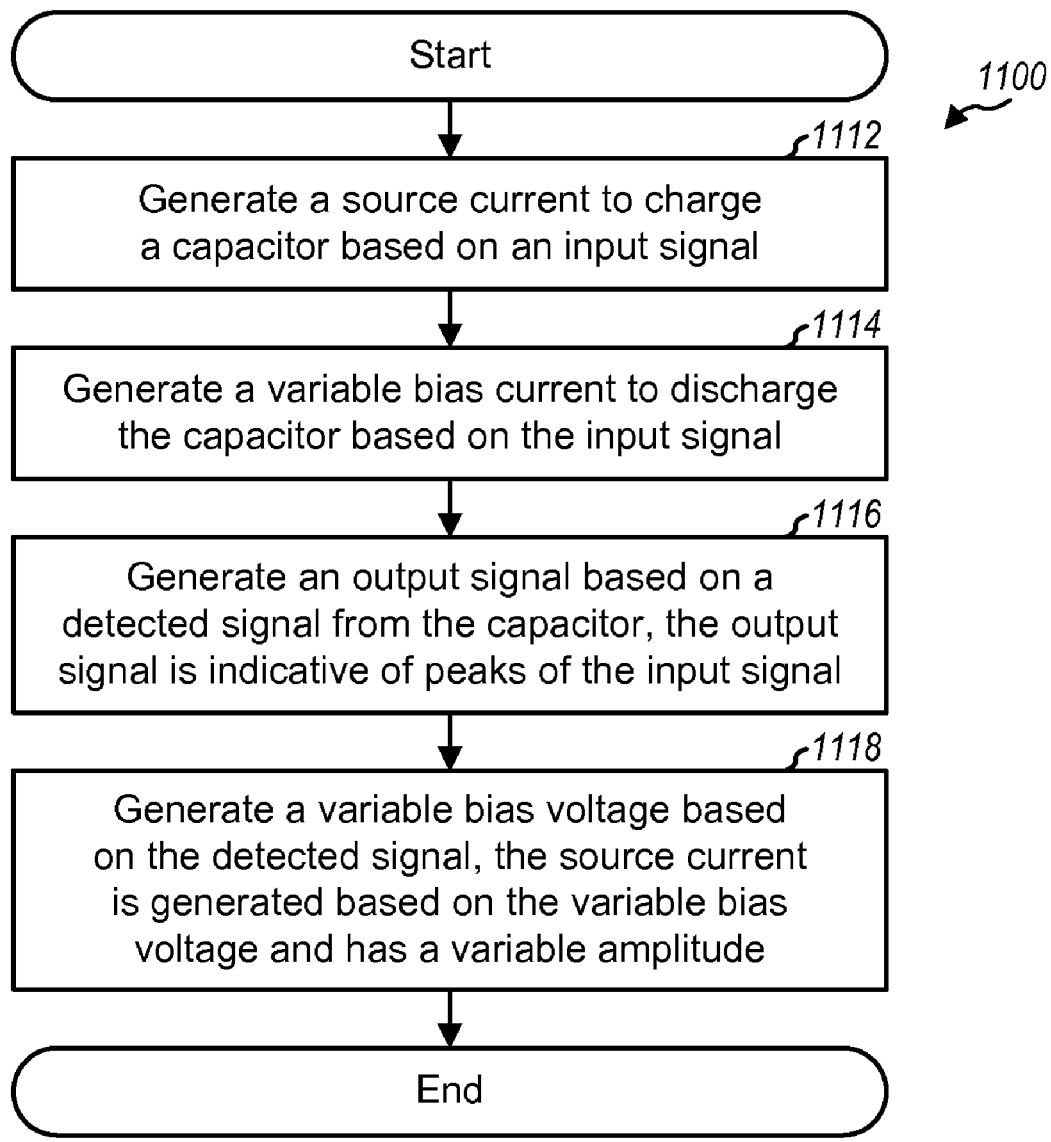
FIG. 11 shows a process for performing peak detection.

FIG. 11 shows an exemplary design of a process 1100 for performing peak detection. A source current to charge a capacitor may be generated based on an input signal (block 1112). A variable bias current to discharge the capacitor may be generated based on the input signal (block 1114). The variable bias current may be low when the input signal is high and may be high when the input signal is low. An output signal may be generated based on a detected signal from the capacitor and may be indicative of peaks of the input signal (block 1116). A variable bias voltage may be generated based on the detected signal (block 1118). The source current may be generated based on the variable bias voltage and may have a variable amplitude. The source current may be high when the detected signal is high and may be low when the detected signal is low.

The high linear fast peak detector described herein may be implemented on an IC, an analog IC, an RFIC, a mixed-signal IC, an ASIC, a printed circuit board (PCB), an electronic device, etc. The peak detector may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the high linear fast peak detector described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a peak detector to receive an input signal and provide an output signal, the peak detector comprising
        a transistor to receive the input signal and provide a source current, the transistor receives an adaptive bias, the adaptive bias being inversely proportional to the input signal, and
        a capacitor coupled to the transistor, wherein the capacitor is charged by the source current, the adaptive bias being independent of a charge on the capacitor.

2. The apparatus of claim 1, wherein the transistor receives an adaptive bias current generated based on feed forward of the input signal.

3. The apparatus of claim 1, wherein the transistor receives an adaptive bias voltage generated based on feed back of a detected signal from the capacitor.

4. The apparatus of claim 1, the transistor receives an adaptive bias current generated based on feed forward of the input signal and an adaptive bias voltage generated based on feed back of a detected signal from the capacitor.

5. An apparatus comprising:
    a peak detector to receive an input signal and provide an output signal, the peak detector comprising
        a first transistor to receive the input signal and provide a source current,
        a variable current source coupled to the first transistor and to receive the input signal and provide a variable bias current based on the input signal, the variable bias current being inversely proportional to the input signal, and
        a capacitor coupled to the first transistor and the variable current source, wherein the capacitor is charged by the source current when the input signal is high and is discharged by the variable bias current when the input signal is low, the variable bias current being independent of a charge on the capacitor.

6. The apparatus of claim 5, the variable current source provides a low bias current inversely proportional to the input signal.

7. The apparatus of claim 5, the variable current source comprising
    a current mirror to provide the variable bias current, the current mirror is enabled when the input signal is low and is disabled when the input signal is high.

8. The apparatus of claim 7, the variable current source further comprising
    a second transistor coupled to the current mirror and to enable or disable the current mirror based on the input signal.

9. The apparatus of claim 5, the variable current source comprising
    a second transistor to receive a control signal generated based on the input signal, and
    a third transistor coupled to the second transistor and to provide the variable bias current, the third transistor is controlled by the second transistor.

10. The apparatus of claim 9, the second transistor has a smaller size than the first transistor.

11. The apparatus of claim 9, wherein the third transistor is not turned off completely and provides a bias current being inversely proportional to the input signal.

12. The apparatus of claim 9, the variable current source further comprising
    a voltage divider to receive the input signal and provide the control signal to the second transistor, the control signal is a fraction of the input signal and avoids fully turning off the second transistor.

13. An apparatus comprising:
    a peak detector to receive an input signal and provide an output signal, the peak detector comprising
        a first transistor to receive the input signal at a gate and source a source current,
        a capacitor coupled to the first transistor, the capacitor is charged by the source current when the input signal is high, and
        a feedback circuit coupled to the first transistor and to receive a detected signal indicative of an envelope of the input signal and to provide a variable bias voltage at the gate of the first transistor being continuously proportional to the detected signal, wherein, the feedback circuit and the first transistor are coupled in a positive feedback loop.

14. The apparatus of claim 13, the feedback circuit provides a higher bias voltage when the envelope of the input signal is high and provides a lower bias voltage when the envelope of the input signal is low, and the first transistor provides a higher source current with the higher bias voltage and provides a lower source current with the lower bias voltage.

15. The apparatus of claim 13, the positive feedback loop has a loop gain of less than one and a loop bandwidth of less than a center frequency of the input signal.

16. The apparatus of claim 13, the feedback circuit comprising
a sensing circuit coupled to the first transistor and to sense a source voltage of the first transistor and provide a sensed current based on the source voltage, and
a voltage generator to generate the variable bias voltage for the first transistor based on the sensed current.

17. The apparatus of claim 16, the sensing circuit comprising
a second transistor coupled to the first transistor and to receive the source voltage of the first transistor, and
a resistor coupled to the second transistor and to convert a source voltage of the second transistor to the sensed current.

18. The apparatus of claim 16, the feedback circuit further comprising
a current mirror coupled to the sensing current and to receive the sensed current and provide a mirrored current, and the voltage generator is coupled to the current mirror and generates the variable bias voltage based on the mirrored current.

19. The apparatus of claim 18, the voltage generator comprising
a current source to provide a reference current, and
a second transistor operated as a resistor and to receive the mirrored current and the reference current and provide the variable bias voltage.

20. An apparatus comprising:
a peak detector to receive an input signal and provide an output signal, the peak detector comprising
a first transistor to receive the input signal at a gate and provide a source current, a variable current source coupled to the first transistor and to receive the input signal and provide a variable bias current based on the input signal,
a capacitor coupled to the first transistor and the variable current source, the capacitor is charged by the source current when the input signal is high and is discharged by the variable bias current when the input signal is low, and
a feedback circuit coupled to the first transistor and to receive a detected signal indicative of an envelope of the input signal and to provide a variable bias voltage at the gate of the first transistor continuously proportional to the detected signal, wherein, the feedback circuit and the first transistor are coupled in a positive feedback loop.

21. The apparatus of claim 20, the variable current source provides a low bias current when the input signal is high and provides a high bias current when the input signal is low.

22. The apparatus of claim 20, the feedback circuit provides a higher bias voltage when the envelope of the input signal is high and provides a lower bias voltage when the envelope of the input signal is low, and the first transistor provides a higher source current with the higher bias voltage and provides a lower source current with the lower bias voltage.

23. The apparatus of claim 20, the variable current source comprising
a current mirror to provide the variable bias current, and
a second transistor coupled to the current mirror and to enable the current mirror when the input signal is low and to disable the current mirror when the input signal is high.

24. The apparatus of claim 20, the feedback circuit comprising
a sensing circuit coupled to the first transistor and to sense a source voltage of the first transistor and provide a sensed current based on the source voltage, and
a voltage generator to generate the variable bias voltage for the first transistor based on the sensed current.

25. A method of performing peak detection, comprising:
generating a source current to charge a capacitor based on an input signal;
generating a variable bias current to discharge the capacitor based on the input signal, the variable bias current being inversely proportional to the input signal; and
generating an output signal based on a detected signal from the capacitor, the output signal is indicative of peaks of the input signal, the variable bias current being independent of a charge on the capacitor.

26. The method of claim 25, the variable bias current is low when the input signal is high and is high when the input signal is low.

27. The method of claim 25, further comprising:
generating a variable bias voltage based on the detected signal, the source current is generated based on the variable bias voltage and has a variable amplitude.

28. The method of claim 27, the source current is proportional to the detected signal.

29. An apparatus comprising:
means for generating a source current to charge a capacitor based on an input signal;
means for generating a variable bias current to discharge the capacitor based on the input signal, the variable bias current being inversely proportional to the input signal; and
means for generating an output signal based on a detected signal from the capacitor, the output signal is indicative of peaks of the input signal, the variable bias current being independent of a charge on the capacitor.

30. The apparatus of claim 29, further comprising:
means for generating a variable bias voltage based on the detected signal, wherein the source current is generated based on the variable bias voltage and has a variable amplitude.

* * * * *